(12) United States Patent
Son et al.

(10) Patent No.: US 8,520,183 B2
(45) Date of Patent: Aug. 27, 2013

(54) DISPLAY SUBSTRATE, LIQUID CRYSTAL DISPLAY INCLUDING THE DISPLAY SUBSTRATE, AND METHOD OF MANUFACTURING THE DISPLAY SUBSTRATE

(75) Inventors: Seung-Suk Son, Asan-si (KR); Duk-Sung Kim, Asan-si (KR); Man-Hong Na, Seoul (KR); Ji-Young Jeong, Cheonan-si (KR); Jae-Hwa Park, Gumi-si (KR)

(73) Assignee: Samsung Display Co., Ltd. (KR)

( * ) Notice: Subject to any disclaimer, the term of this patent is extended or adjusted under 35 U.S.C. 154(b) by 256 days.

(21) Appl. No.: 13/084,360

(22) Filed: Apr. 11, 2011

(65) Prior Publication Data

US 2011/0255045 A1 Oct. 20, 2011

(30) Foreign Application Priority Data

Apr. 20, 2010 (KR) .................. 10-2010-0036426

(51) Int. Cl.
*G02F 1/1333* (2006.01)
*G02F 1/1343* (2006.01)

(52) U.S. Cl.
USPC ............. 349/158; 349/38; 349/39; 349/139; 349/147

(58) Field of Classification Search
USPC ................. 349/158, 139, 147, 38, 39
See application file for complete search history.

(56) References Cited

U.S. PATENT DOCUMENTS

| | | | | |
|---|---|---|---|---|
| 6,198,132 B1 * | 3/2001 | Ishida et al. | ............. | 257/347 |
| 6,862,060 B2 * | 3/2005 | Yoon et al. | ............. | 349/114 |
| 7,142,277 B2 * | 11/2006 | Choi et al. | ............. | 349/155 |
| 7,205,570 B2 * | 4/2007 | Kim et al. | ............. | 257/72 |
| 7,800,101 B2 * | 9/2010 | Song et al. | ............. | 257/40 |
| 7,911,568 B2 * | 3/2011 | Jung et al. | ............. | 349/114 |

* cited by examiner

*Primary Examiner* — Mike Qi
(74) *Attorney, Agent, or Firm* — Innovation Counsel LLP

(57) ABSTRACT

Provided are a display substrate, a liquid crystal display (LCD) including the display substrate, and a method of manufacturing the display substrate. The display substrate includes: an insulating substrate; a gate wiring formed on the insulating substrate and extending generally in a first direction; a data wiring which is insulated from the gate wiring, intersects the gate wiring, and which extends generally in a second direction; a pixel electrode formed in a pixel region defined by the gate wiring and the data wiring; and a storage wiring which is formed on the same layer as the gate wiring, is overlapped by the data wiring to be insulated from the data wiring, and which extends generally in the second direction, wherein each of the gate wiring and the storage wiring has a tapered surface oriented generally at an inclination angle of approximately 30 degrees or less with respect to the insulating substrate.

30 Claims, 17 Drawing Sheets

# DISPLAY SUBSTRATE, LIQUID CRYSTAL DISPLAY INCLUDING THE DISPLAY SUBSTRATE, AND METHOD OF MANUFACTURING THE DISPLAY SUBSTRATE This application claims priority to Korean Patent Application No. 10-2010-0036426 filed on Apr. 20, 2010 in the Korean Intellectual Property Office, the disclosure of which is incorporated herein by reference in its entirety.

BACKGROUND OF THE INVENTION

1. Field of the Invention

The present invention relates generally to flat panel displays. More specifically, the present invention relates to wiring structures and associated fabrication methods for flat panel displays.

2. Description of the Related Art

Examples of commonly used image display devices include cathode ray tubes (CRTs), liquid crystal displays (LCDs), plasma display panel (PDP) apparatuses, and electronic paper displays (EPDs). These image display devices are increasingly required to be smaller in size, lighter in weight, and lower in power consumption.

An LCD typically includes a color filter substrate having color filters, a thin-film transistor (TFT) substrate having a TFT array, and a liquid crystal layer interposed between the color filter substrate and the TFT substrate.

SUMMARY OF THE INVENTION

It is an objective of the present invention to prevent the leakage of light at a step between a gate wiring and a storage wiring.

Aspects of the present invention provide a display substrate ithat largely prevents light from leaking at a step between a gate wiring and a storage wiring. Other aspects of the present invention also provide a liquid crystal display (LCD) incorporating this display substrate.

Aspects of the present invention also provide a method of manufacturing such a display substrate.

However, aspects of the present invention are not restricted to the ones set forth herein. The above and other aspects of the present invention will become more apparent to one of ordinary skill in the art to which the present invention pertains by referencing the detailed description of the present invention given below.

According to an aspect of the present invention, there is provided a display substrate including: an insulating substrate; a gate wiring formed on the insulating substrate and extending generally in a first direction; a data wiring which is insulated from the gate wiring, intersects the gate wiring, and which extends generally in a second direction; a pixel electrode formed in a pixel region defined by the gate wiring and the data wiring; and a storage wiring which is formed on the same layer as the gate wiring, is overlapped by the data wiring to be insulated from the data wiring, and which extends generally in the second direction, wherein each of the gate wiring and the storage wiring has a tapered surface oriented generally at an inclination angle of approximately 30 degrees or less with respect to the insulating substrate.

According to another aspect of the present invention, there is provided an LCD including: a first display substrate including an insulating substrate, a gate wiring \ formed on the insulating substrate and extending in a first direction, a data wiring which is insulated from the gate wiring, intersects the gate wiring, and which extends in a second direction, a pixel electrode formed in a pixel region defined by the gate wiring and the data wiring, and a storage wiring which is formed on the same layer as the gate wiring, is overlapped by the data wiring to be insulated from the data wiring, and which extends in the second direction; a second display substrate facing the first display substrate and comprising a black matrix; and a liquid crystal layer interposed between the first display substrate and the second display substrate, wherein each of the gate wiring and the storage wiring has a tapered surface oriented generally at an inclination angle of approximately 30 degrees or less with respect to the insulating substrate.

According to another aspect of the present invention, there is provided a method of manufacturing a display substrate. The method includes: forming a gate wiring on the insulating substrate, the gate wiring extending in a first direction; forming a storage wiring on the same layer as the gate wiring, the storage wiring extending in a second direction; forming a data wiring which is insulated from the gate wiring, intersects the gate wiring, and which extends in the second direction; and forming a pixel electrode in a pixel region defined by the gate wiring and the data wiring, wherein each of the gate wiring and the storage wiring has a tapered surface oriented generally at an inclination angle of approximately 30 degrees or less with respect to the insulating substrate.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION OF THE INVENTION

Figure 1:
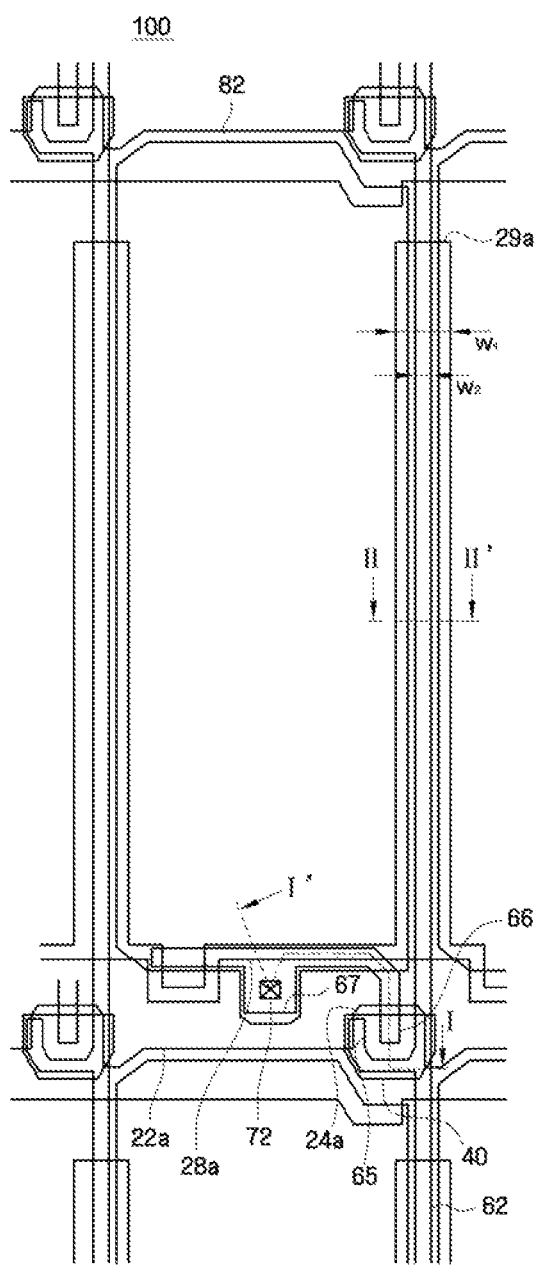
FIG. 1 is a layout diagram of a display substrate according to a first exemplary embodiment of the present invention.

Advantages and features of the present disclosure of invention and methods of accomplishing the same may be understood more readily by reference to the following detailed description of exemplary embodiments and the accompanying drawings. The present teaching may, however, be embodied in many different forms and should not be construed as being limited to the embodiments set forth herein. Rather, these embodiments are provided so that this disclosure will be thorough and complete and will fully convey the concept and teachings that are in accordance with the present disclosure. In the drawings, sizes and relative sizes of layers and regions may be exaggerated for clarity.

It will be understood that when an element or layer is referred to as being "on" another element or layer, the element or layer can be directly on another element or layer or intervening elements or layers may also be present. In contrast, when an element is referred to as being "directly on" another element or layer, there are no intervening elements or layers present. Like numbers refer to like elements throughout. As used herein, the term "and/or" includes any and all combinations of one or more of the associated listed items.

Spatially relative terms, such as "below", "beneath", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation, in addition to the orientation depicted in the figures.

Embodiments of the invention are described herein with reference to (plan and) cross-section illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the invention Hereinafter, a display substrate, a liquid crystal display (LCD) including the display substrate, and a method of manufacturing the display substrate according to exemplary embodiments of the present invention will be described with reference to the attached drawings.

Figure 2:
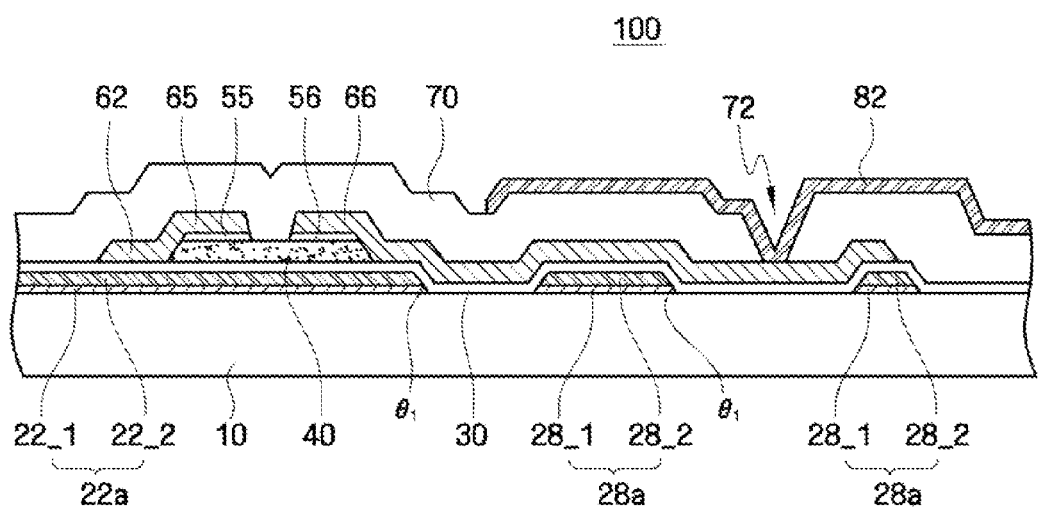
FIG. 2 is a cross-sectional view of the display substrate taken along the line I-I' of FIG. 1.
Figure 3:
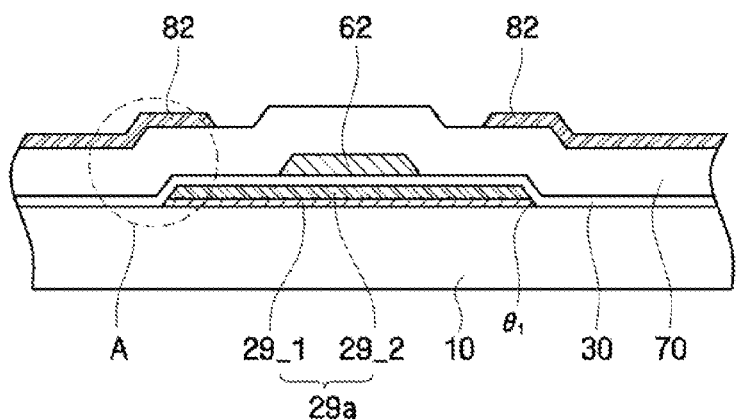
FIG. 3 is a cross-sectional view of the display substrate taken along the line II-II' of FIG. 1.
Figure 4:
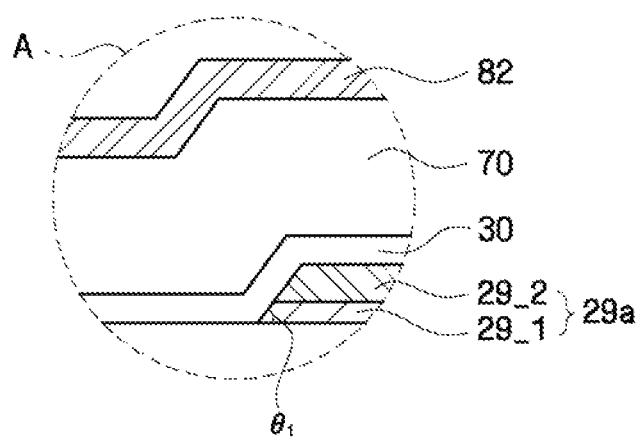
FIG. 4 is an enlarged view of a region 'A' of FIG. 3.

First, a display substrate according to a first exemplary embodiment of the present invention will be described with reference to FIGS. 1 through 4. FIG. 1 is a layout diagram of a display substrate 100 according to a first exemplary embodiment of the present invention. FIG. 2 is a cross-sectional view of the display substrate 100 taken along the line I-I' of FIG. 1. FIG. 3 is a cross-sectional view of the display substrate 100 taken along the line II-IF of FIG. 1. FIG. 4 is an enlarged view of a region 'A' of FIG. 3.

Referring to FIGS. 1 through 4, the display substrate 100 according to the first exemplary embodiment may include a gate wiring 22a and 24a, a storage wiring 28a and 29a, a gate insulating film 30, an active layer 40, ohmic contact layers 55 and 56, a data wiring 62, 65, 66 and 67, a passivation film 70, and a pixel electrode 82 which are formed on a first insulating substrate 10.

The first display substrate 10 may be made of a material having heat-resistant and light-transmitting properties, such as transparent glass or plastic.

The gate wiring 22a and 24a and the storage wiring 28a and 29a are formed on the first insulating substrate 10 and extend substantially in a first direction to be parallel to each other. The gate wiring 22a and 24a and the storage wiring 28a and 29a may be formed on the same layer. For example, each may be formed on the first insulating substrate 10.

The gate wiring 22a and 24a includes a gate line 22a which extends substantially in the first direction, e.g., a horizontal direction, and delivers a gate signal. The gate wiring also includes a gate electrode 24a which projects from the gate line 22a in the form of a protrusion. The gate electrode 24a is one of three terminals of a thin-film transistor, along with a source electrode 65 and a drain electrode 66 which will be described later.

The storage wiring 28a and 29a includes a horizontal portion 28a which extends in the first direction to be parallel to the gate wiring 22a and 24a. The storage wiring also includes a vertical portion 29a which branches off from the horizontal portion 28a substantially in a second direction. The vertical portion 29a is overlapped by the data wiring 62, 65, 66 and 67 which will be described later.

The storage wiring 28a and 29a may receive a storage voltage and form a storage capacitor together with the pixel electrode 82 which will be described later.

The horizontal portion 28a of the storage wiring 28a and 29a may be separated from the gate wiring 22a and 24a (more specifically, from the gate line 22a), and extend parallel to the gate line 22a. The horizontal portion 28a may be overlapped by the pixel electrode 82, as described later. Accordingly, a storage capacitor may be formed between the overlapping pixel electrode 82 and horizontal portion 28a of the storage wiring 28a and 29a.

The vertical portion 29a branches off from the horizontal portion 28a and extends substantially in the second direction, for example, a vertical direction. Specifically, the horizontal portion 28a may extend horizontally to be parallel to a long side of the display substrate 100, and a plurality of vertical portions 29a may branch off from each corresponding horizontal portion 28a and extend vertically, to be parallel to a short side of the display substrate 100.

A distal end of the vertical portion 29a adjoins the gate line 22a of an adjacent pixel. However, the distal end of the vertical portion 29a is separated from the gate line 22a of the adjacent pixel, so that the vertical portion 29a is not electrically connected to the gate line 22a of the adjacent pixel.

The vertical portion 29a is overlapped by a data line 62, which will be described later, and also performs a light blocking function. Accordingly, a width of a black matrix that is to be formed on a color filter substrate 200 (see FIG. 8) can be reduced, thereby increasing pixel aperture ratio.

To perform its light blocking function, the vertical portion 29a may be formed to have a greater width $w_1$ than a width $w_2$ of the data line 62. Edges of the vertical portion 29a may be overlapped by the pixel electrode 82 along the second direction, e.g., the vertical direction, in order to prevent light emitted from a backlight assembly (not shown) from leaking That is, the vertical portion 29a is overlapped by a pair of neighboring pixel electrodes 82. The overlap between the pixel electrode 82 and vertical portion 29a forms a storage capacitor.

Referring again to FIGS. 1 through 4, the gate wiring 22a and 24a and the storage wiring 28a and 29a may be made of any suitable metal, for example an aluminum (Al)-based metal such as Al or an Al alloy, a silver (Ag)-based metal such as Ag or an Ag alloy, a copper (Cu)-based metal such as Cu or a Cu alloy, a molybdenum (Mo)-based metal such as Mo or a Mo alloy, chrome (Cr), titanium (Ti), or tantalum (Ta).

In addition, the gate wiring 22a and 24a and the storage wiring 28a and 29a may have a multi-film structure consisting of two or more conductive films with different physical characteristics. That is, the gate wiring 22a and 24a may consist of a first conductive film 22_1 and a second conductive film 22_2, and the storage wiring 28a and 29a may consist of first conductive films 28_1 and 29_1 and second conductive films 28_2 and 29_2. The first conductive films 22_1, 28_1 and 29_1 and the second conductive films 22_2, 28_2 and 29_2 may be made of materials having different etch rates. For example, an etch rate of each of the first conductive films 22_1, 28_1 and 29_1 may be higher than that of each of the second conductive films 22_2, 28_2 and 29_2. The first conductive films 22_1, 28_1 and 29_1 may contain, for example, Ti, and the second conductive films 22_2, 28_2 and 29_2 may contain, for example, Cu. Here, Ti may improve adhesion between Cu and the first insulating substrate 10.

Each of the first conductive films 22_1, 28_1 and 29_1 may be formed to a thickness of 300 Å or less in view of the degree of improvement in adhesion between the second conductive films 22_2, 28_2 and 29_2 and the first insulating substrate 10, and in view of the electrical conductivity of the gate wiring 22a and 24a and the storage wiring 28a and 29a. If each of the first conductive films 22_1, 28_1 and 29_1 is formed to a thickness of 300 Å or more, it takes too long time to etch the first conductive films 22_1, 28_1 and 29_1 and the second conductive films 22_2, 28_2 and 29_2 simultaneously.

Referring to FIGS. 2 through 4, the gate wiring 22a and 24a and the storage wiring 28a and 29a may be tapered. Here, an inclination angle $\theta_1$ of an inclined surface of each of the gate wiring 22a and 24a and the storage wiring 28a and 29a may be 30 degrees or less with respect to a top surface of the first insulating substrate 10. In particular, with reference to FIG. 3, outer edges of each layer of the gate wiring 22a and 24a and the storage wiring 28a and 29a are substantially coplanar, and are inclined at angle $\theta_1$. Accordingly, the profiles of the gate insulating film 30 or the passivation film 70 that are formed on the gate wiring 22a and 24a and the storage wiring 28a and 29a may be relatively gentle. In addition, a surface of a lower alignment film (not shown) formed around upper portions of the gate wiring 22a and 24a and the storage wiring 28a and 29a may be substantially parallel to a surface of the first insulating substrate 10.

An inclination angle of each of the first conductive films 22_1, 28_1 and 29_1 may be smaller than that of each of the second conductive films 22_2, 28_2 and 29_2. This is because the first conductive films 22_1, 28_1 and 29_1 may be formed thinner than the second conductive films 22_2, 28_2 and 29_2.

When the first conductive films 22_1, 28_1 and 29_1 are thinner than their respective second conductive films 22_2, 28_2 and 29_2, the overall inclination angles $\theta_1$ of the gate wiring 22a and 24a and the storage wiring 28a and 29a may not be affected by the inclination angles of the first conductive films 22_1, 28_1 and 29_1. That is, the overall inclination angles $\theta_1$ of the gate wiring 22a and 24a and the storage wiring 28a and 29a may be approximated as the inclination angles of the thicker second conductive films 22_2, 28_2 and 29_2. Thus, the inclination angles of the second conductive films 22_2, 28_2 and 29_2 should be 30 degrees or less.

Accordingly, liquid crystal molecules arranged around the upper portions of the gate wiring 22a and 24a and the storage wiring 28a and 29a can be induced to be arranged almost perpendicular to the first insulating substrate 10. Therefore, when a dark color is displayed, even if the gate wiring 22a and 24a and the storage wiring 28a and 29a are not parallel to a transmission axis of a polarizer, the leakage of light, which may arise from a step between the gate wiring 22a and 24a and the storage wiring 28a and 29a, can be largely minimized. In addition, a contrast ratio of the LCD can be enhanced.

The gate insulating film 30 is formed on the first insulating substrate 10 to cover the gate wiring 22a and 24a and the storage wiring 28a and 29a. The gate insulating film 30 may be made of an inorganic insulating material such as silicon oxide (SiOx) or silicon nitride (SiNx), or may be made of an organic insulating material such as benzocyclobutene (BCB), an acrylic material, or polyimide.

The active layer 40 is formed on part of the gate insulating film 30. The active layer 40 may be made of a conductive organic material or an oxide semiconductor containing at least one metal oxide selected from hydrogenated amorphous silicon, polycrystalline silicon, gallium oxide, indium oxide, zinc oxide, and tin oxide.

The active layer 40 may have various shapes, including an island shape and a linear shape. When the active layer 40 is formed in the shape of an island as in the current exemplary embodiment, it overlaps the gate electrode 24a and is at least partially overlapped by the source electrode 65 and the drain electrode 66. The shape of the active layer 40 is not limited to this island shape however, and may vary. When the active layer 40 is formed linearly, it may be disposed under the data line 62 and extend onto the gate electrode 24a.

The ohmic contact layers 55 and 56 may be formed on the active layer 40. The ohmic contact layers 55 and 56 may be made of silicide, n+ hydrogenated amorphous silicon doped with n-type impurities in high concentration, or a material doped with p-type impurities, such as ITO. That is, the ohmic contact layers 55 and 56 may be formed in pairs on the active layer 40 to improve contact characteristics between the source and drain electrodes 65 and 66 and the active layer 40. When good contact characteristics can be secured between the active layer 40 and the source and drain electrodes 65 and 66 formed on the active layer 40, the ohmic contact layers 55 and 56 may be omitted.

The data wiring 62, 65, 66 and 67 is formed on the active layer 40 and the gate insulating film 30. The data wiring 62, 65, 66 and 67 extends substantially in the second direction, for example, the vertical direction. The data wiring 62, 65, 66 and 67 includes the data line 62, the source electrode 65, and the drain electrode 66. The data line 62 is insulated from the gate line 22a and intersects the gate line 22a to define a pixel. The source electrode 65 branches off from the data line 62 and extends onto the active layer 40, and the drain electrode 66 is separated from the source electrode 65 to face the source electrode 65.

The data line 62 extends vertically to intersect the gate line 22, and receives a data signal.

The source electrode 65 branches off from the data line 62 and has, for example, a general 'J' shape. The source electrode 65 overlaps at least part of the active layer 40. The shape of the source electrode 65 is not limited to the 'J' shape and may vary.

An end of the drain electrode 66 is located in a concave portion of the J-shaped source electrode 65, and overlaps at least part of the active layer 40.

An enlarged drain electrode portion 67 extends from an end of the drain electrode 66, and is electrically connected to the pixel electrode 82. The enlarged drain electrode portion 67 may be wider than the drain electrode 66. The enlarged drain electrode portion 67 may be formed outside a pixel region in order to avoid reduction in aperture ratio.

To minimize a reduction in the aperture ratio, a region extending from one end of the drain electrode 66 to the enlarged drain electrode portion 67 may be formed in a linear shape, and may overlap the horizontal portion 28a of the storage wiring 28a and 29a.

As used herein, a pixel region may denote a region defined by the gate wiring 22a and 24a and the data wiring 62, 65, 66 and 67. The pixel region may also be understood as a region through which light emitted from the backlight assembly passes. Therefore, a color filter region (see reference numeral 230 in FIG. 8) of the color filter substrate 200 (see FIG. 8), which corresponds to a pixel region of the display substrate 100, may also be understood as a pixel region.

The data wiring 62, 65, 66 and 67 may be made of Cr, a Mo-based metal, or a refractory metal such as Ta and Ti. In addition, the data wiring 62, 65, 66 and 67 may have a multi-film structure consisting of a lower film (not shown) which is made of a refractory metal, and an upper film (not shown) which is made of a material with low resistivity and is disposed on the lower film. An example of the multi-film structure is a double film consisting of a Cr lower film and an Al upper film, an Al lower film and a Mo upper film, or a Ti lower film and a Cu upper film. Alternatively, the multi-film structure may be a triple film consisting of Mo—Al—Mo films.

The passivation film 70 is formed of an insulating film on the data line 62, the drain electrode 66, and an exposed portion of the semiconductor layer 40. The passivation film 70 may be made of an inorganic material such as silicon nitride or silicon oxide, an organic material having photosensitivity and superior planarization characteristics, or a low-k insulating material formed by plasma enhanced chemical vapor deposition (PECVD), such as a-Si:C:O or a-Si:O:F. The passivation film 70 may be a double film consisting of silicon oxide and silicon nitride. Alternatively, the passivation film 70 may be a double film consisting of a lower inorganic film and an upper organic film.

A contact hole 72 is formed in the passivation film 70 to expose the enlarged drain electrode portion 67.

The pixel electrode 82 is formed on the passivation film 70 and is electrically connected to the drain electrode 66 by the contact hole 72. A drain electrode connection portion may be formed on a side of the pixel electrode 82, and may be electrically connected to the drain electrode 66. More specifically, a portion of the enlarged drain electrode portion 67 is formed upon the contact hole 72. Accordingly, the drain electrode connection portion receives a data voltage via the drain electrode 66. The drain electrode connection portion may protrude outward from a pixel region, in which light is output from the backlight assembly, in order to prevent a reduction in the aperture ratio.

The pixel electrode 82 may be made of a transparent conductor such as indium tin oxide (ITO) or indium zinc oxide (IZO), or may be made of a reflective conductor such as Al.

Hereinafter, a display substrate according to a first modified embodiment of the first exemplary embodiment of the present invention will be described with reference to FIGS. 5A through 7.

Figure 5A:
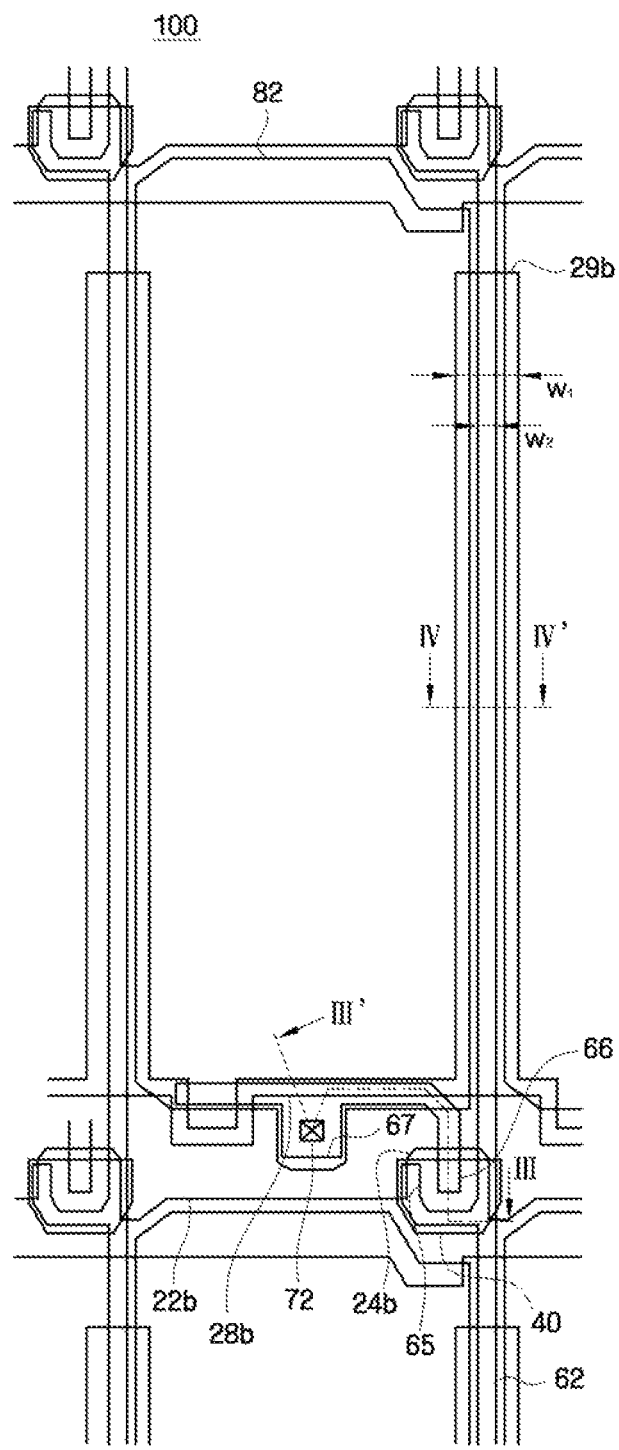
FIG. 5A is a layout diagram of a display substrate according to a first modified embodiment of the first exemplary embodiment of the present invention.
Figure 5B:
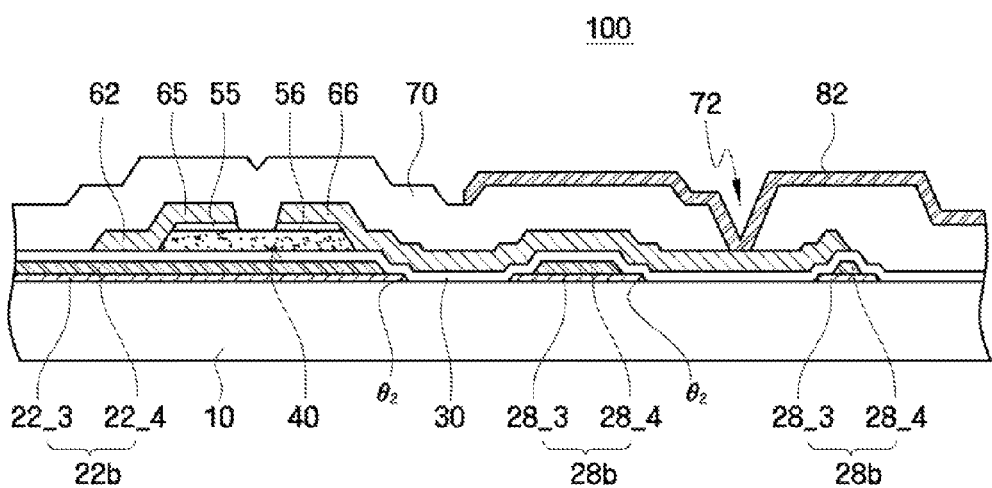
FIG. 5B is a cross-sectional view of the display substrate taken along the line III-III' of FIG. 5A.
Figure 6:
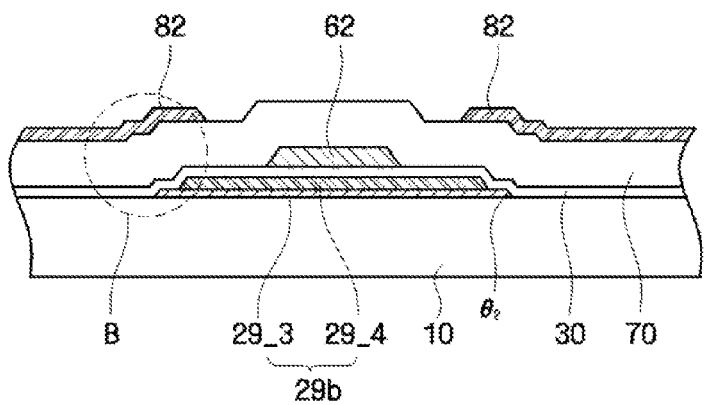
FIG. 6 is a cross-sectional view of the display substrate taken along the line IV-IV' of FIG. 5A.
Figure 7:
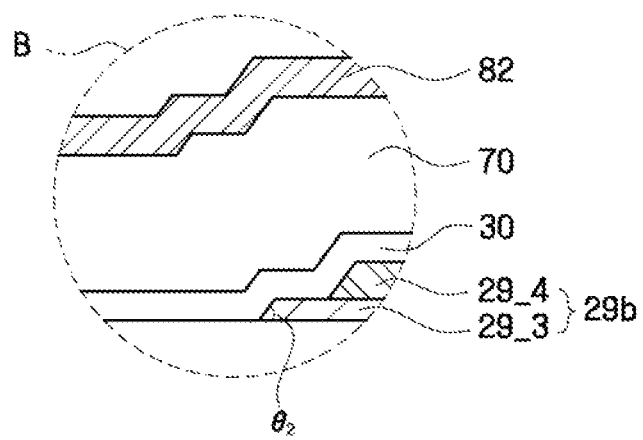
FIG. 7 is an enlarged view of a region 'B' of FIG. 6.

FIG. 5A is a layout diagram of a display substrate 100 according to a first modified embodiment of the first exemplary embodiment of the present invention. FIG. 5B is a cross-sectional view of the display substrate 100 taken along the line III-III' of FIG. 5A. FIG. 6 is a cross-sectional view of the display substrate 100 taken along the line IV-IV' of FIG. 5A. FIG. 7 is an enlarged view of a region 'B' of FIG. 6. For simplicity, elements having the same functions as those illustrated in the drawings for the first exemplary embodiment are indicated by like reference numerals, and thus their description will be largely omitted.

As shown in FIGS. 5A through 7, the display substrate 100 according to the first modified embodiment has largely the same structure as the display substrate 100 according to the first exemplary embodiment, except for the following features. In particular, each of a gate wiring 22b and 24b and a storage wiring 28b and 29b consists of two or more conductive films having different boundaries, as shown in FIGS. 5B through 7. For example, the gate wiring 22b and 24b and the storage wiring 28b and 29b shown in FIGS. 5B through 7 have a double-film structure.

Referring to FIGS. 5B through 7, the gate wiring 22b and 24b may consist of a third conductive film 22_3 and a fourth conductive film 22_4, and the storage wiring 28b and 29b may consist of third conductive films 28_3 and 29_3 and fourth conductive films 29_3 and 29_4. The third conductive films 22_3, 28_3 and 29_3 may be wider than the fourth conductive films 22_4, 28_4 and 29_4. In addition, the third conductive films 22_3, 28_3 and 29_3 may be tapered. Here, an inclination angle $\theta_2$ of an inclined surface of each of the third conductive films 22_3, 28_3 and 29_3 may be 30 degrees or less with respect to a top surface of a first insulating substrate 10. Here, each gate wiring 22a and 24a and storage wiring 28a and 29a has two layers, with outer edges of the lower layer extending beyond the outer edges of the upper layer, so that edges of the upper and lower layers of each wiring are offset from each other.

Widths of the third conductive films 22_3, 28_3 and 29_3 are different from those of the fourth conductive films 22_4, 28_4 and 29_4. That is, the upper surfaces of third films 22_3, 28_3 and 29_3 extend beyond the lower surfaces of their respective fourth films 22_4, 28_4 and 29_4. For example, fourth conductive film 29_4 has width $w_4$, while third conductive film 29_3 extends to width $w_1$, as shown in FIG. 6. This extends the length over which the wirings 22b, 24b, 28b, 29b increase in height, thus effectively decreasing their overall inclination angle. Thus, the profile of a gate insulating film 30 or a passivation film 70 formed on the gate wiring 22b and 24b and the storage wiring 28b and 29b may be relatively gentle. In addition, a surface of a lower alignment film (not shown) formed around upper portions of the gate wiring 22b and 24b and the storage wiring 28b and 29b may be substantially parallel to a surface of the first insulating substrate 10. Since the effect of preventing the leakage of light accomplished by this structure is substantially the same as the light leakage prevention effect described above in the first exemplary embodiment, a description thereof will be omitted.

Hereinafter, an LCD according to a second exemplary embodiment of the present invention will be described with reference to FIGS. 1, and 8 through 10.

Figure 8:
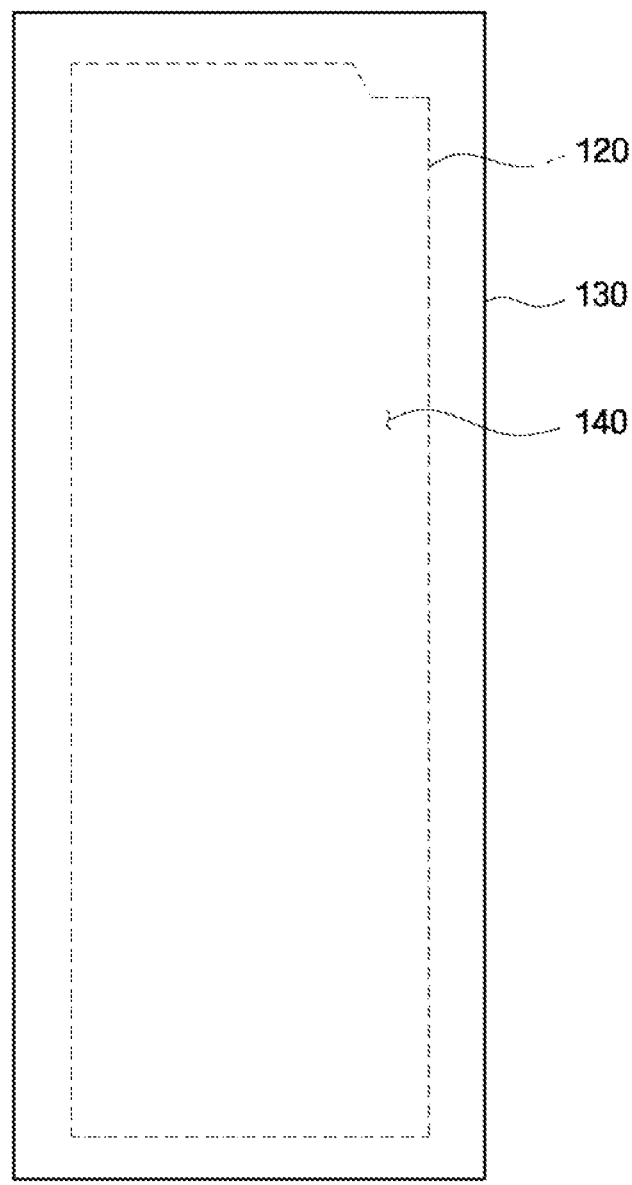
FIG. 8 is a layout diagram of a color filter substrate included in a liquid crystal display (LCD) according to a second exemplary embodiment of the present invention.
Figure 9:
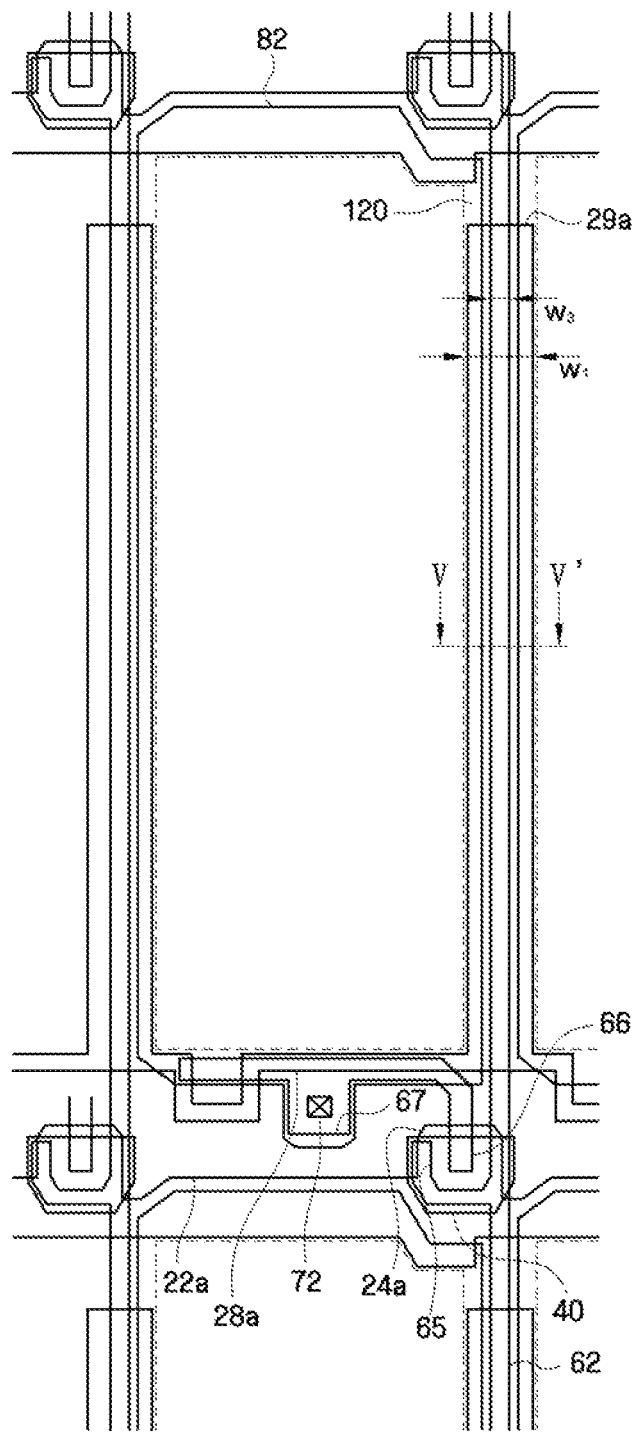
FIG. 9 is a layout diagram of the LCD according to the second exemplary embodiment of the present invention.
Figure 10:
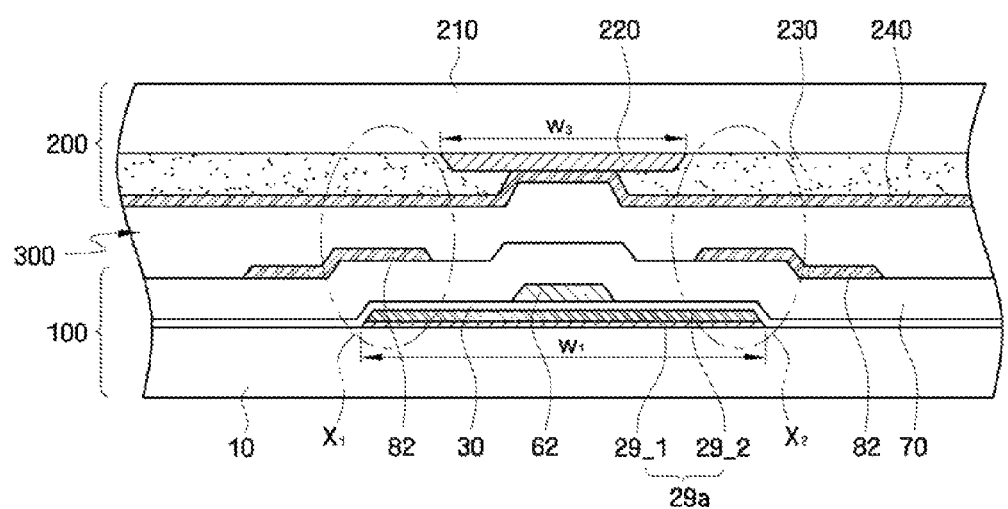
FIG. 10 is a cross-sectional view of the LCD taken along the V-V' of FIG. 9.

FIG. 8 is a layout diagram of a color filter substrate 200 included in an LCD according to a second exemplary embodiment of the present invention. FIG. 9 is a layout diagram of the LCD according to the second exemplary embodiment of the present invention. FIG. 10 is a cross-sectional view of the LCD taken along the line V-V' of FIG. 9.

Referring to FIGS. 8 through 10, the LCD according to the second exemplary embodiment may include a display substrate 100, the color filter substrate 200, and a liquid crystal layer 300. The display substrate 100 included in the LCD according to the second exemplary embodiment is substantially the same as the display substrate 100 according to the first exemplary embodiment, and thus a description thereof will be omitted.

The color filter substrate 200 includes a black matrix 220, color filters 230, an overcoat film (not shown), a common electrode 240, and the like which are formed on a second insulating substrate 210. The color filter substrate 200 faces the display substrate 100.

The second insulating substrate 210 of the color filter substrate 200 may be made of a material having heat-resistant and light-transmitting properties, such as transparent glass or plastic.

The black matrix 220 is formed of an opaque material, such as Cr, is on the second insulating substrate 210, and separates pixel regions from each other.

The black matrix 220 is disposed in a matrix shape along a first direction and a second direction. A width $w_3$ of the black matrix 220 in the second direction (which can be, for example, a vertical direction) may be smaller than a width $w_1$ of a vertical portion 29a of a storage wiring 28a and 29a. That is, since the vertical portion 29a of the storage wiring 28a and 29a performs a light blocking function, the width of the black matrix 220 can be reduced, thereby increasing the aperture ratio of a pixel. To this end, the vertical portion 29a of the storage wiring 28a and 29a may be overlapped by the black matrix 220, with the black matrix 220 being narrower than the vertical portion 29a. That is, right and left boundaries of the black matrix 220 may be disposed within right and left boundaries of the vertical portion 29a of the storage wiring 28a and 29a.

The red, green and blue color filters 230 are formed in desired order in the pixel regions separated from each other by the black matrix 220. The color filters 230 are made of materials that transmit light of different colors, to allow light of a predetermined wavelength band to pass therethrough.

The color filters 230 may be arranged in any manner, such as a stripe, mosaic, or delta pattern. However, this example embodiment employs stripe-patterned color filters 230. Color filters of the same color are arranged in the second direction, for example, the vertical direction. As one example, an $n^{th}$ (n is a natural number) color filter in the vertical direction may be a red color filter, an $(n+1)^{th}$ color filter may be a green color filter, and an $(n+2)^{th}$ color filter may be a blue color filter.

The overcoat film (not shown) made of an organic material may be disposed on the color filters 230. The common electrode 240 is disposed on the overcoat film and can be made of a transparent conductive material such as ITO or IZO. Although not shown in the drawings, a spacer may be formed between the display substrate 100 and the color filter substrate 200 to maintain a predetermined gap therebetween.

In this gap, the liquid crystal layer 300 is disposed. That is, the liquid crystal layer 300 is interposed between the display substrate 100 and the color filter substrate 200. The transmittance of the liquid crystal layer 300 is controlled by a voltage difference between the pixel electrode 82 and the common electrode 240.

Hereinafter, a second modified embodiment of the second exemplary embodiment of the present invention will be described with reference to FIGS. 8, 11A and 11B.

Figure 11A:
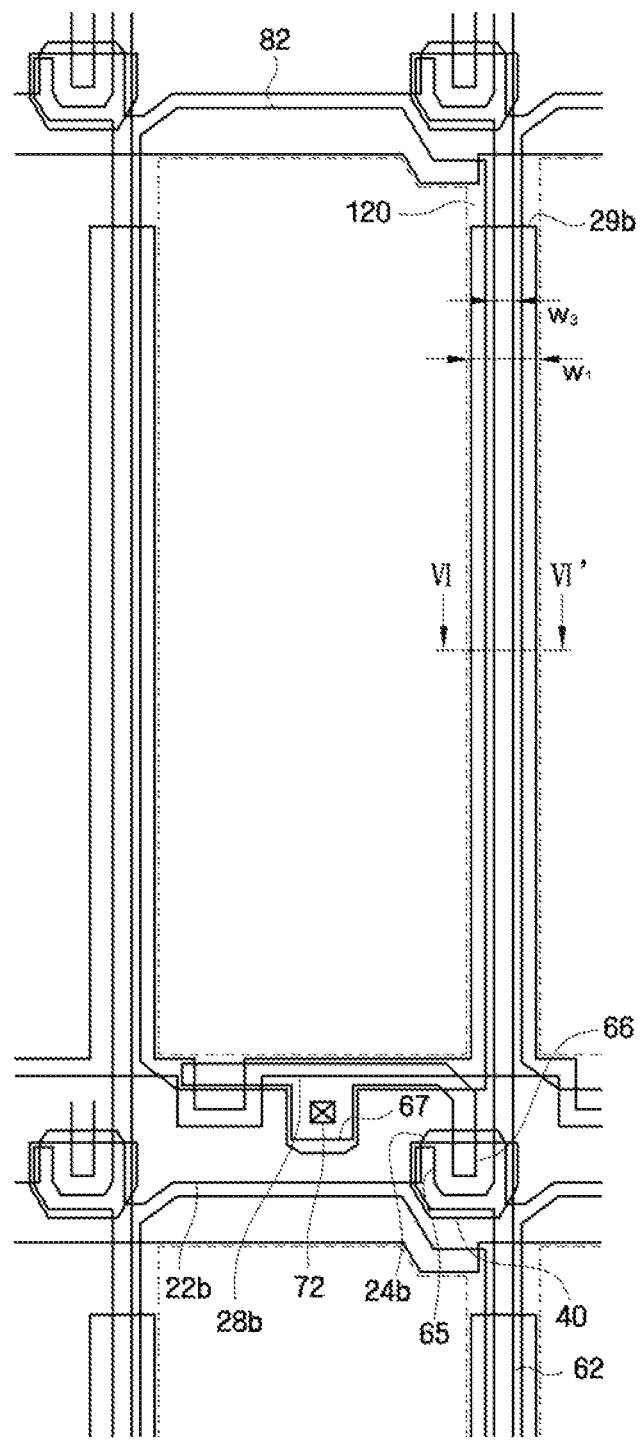
FIG. 11A is a layout diagram of an LCD according to a second modified embodiment of the second exemplary embodiment of the present invention.

FIG. 11A is a layout diagram of an LCD according to a second modified embodiment of the second exemplary embodiment of the present invention. FIG. 11B is a cross-sectional view of the LCD taken along the line VI-VI' of FIG. 11A. For simplicity, elements having the same functions as those illustrated in the drawings for the second exemplary embodiment are indicated by like reference numerals, and thus their description will be omitted.

Figure 11B:
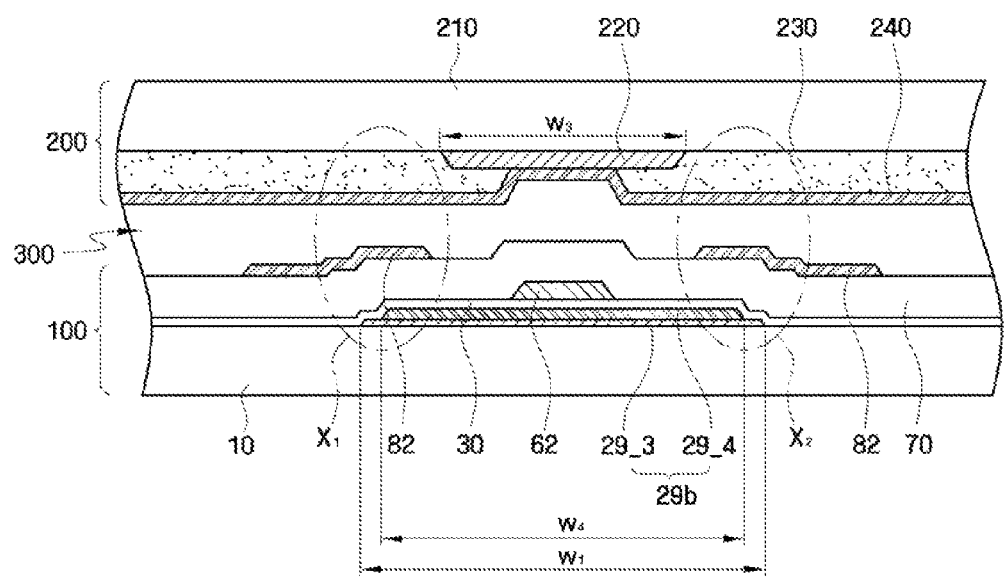
FIG. 11B is a cross-sectional view of the LCD taken along the line VI-VI' of FIG. 11A.

Referring to FIGS. 8, 11A and 11B, the LCD according to the second modified embodiment may include a display substrate 100, a color filter substrate 200, and a liquid crystal layer 300. The display substrate 100 included in the LCD according to the second modified embodiment is substantially the same as the display substrate 100 according to the first modified embodiment, and thus a description thereof will be omitted.

As shown in FIGS. 11A and 11B, the LCD according to the second modified embodiment has basically the same structure as the LCD according to the second exemplary embodiment except for the following features. That is, as shown in FIGS. 11A and 11B, each of a gate wiring 22b and 24b and a storage wiring 28b and 29b consists of two or more conductive films having different widths and boundaries. Since this feature is largely identical to the feature described above in the first modified embodiment, a description thereof will be omitted.

Figure 12:
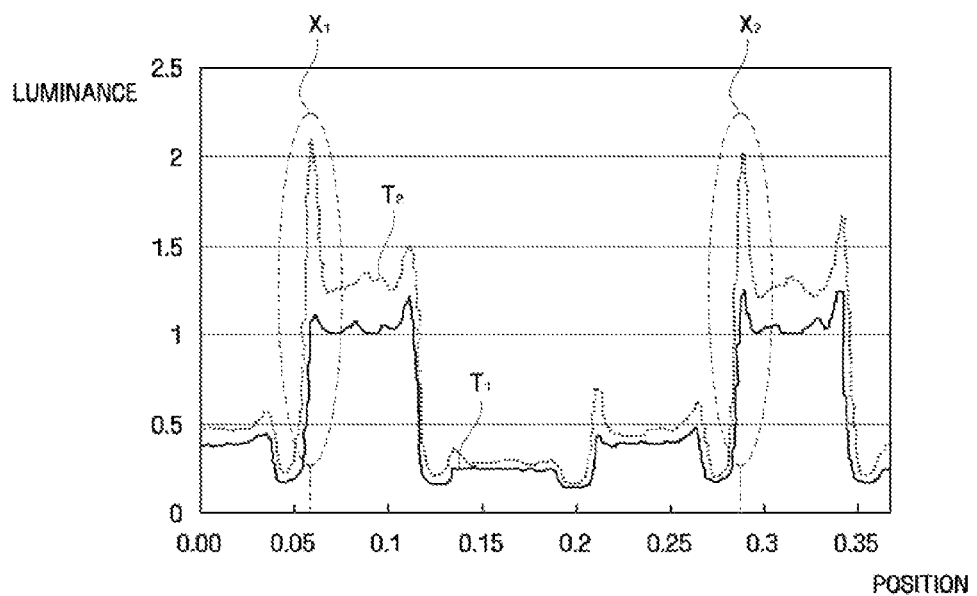
FIG. 12 is a diagram illustrating the light leakage prevention effect of the LCDs according to the second exemplary embodiment and the second modified embodiment of the present invention.

Hereinafter, the light leakage prevention effect of the LCDs according to the second exemplary embodiment and the second modified embodiment will be described with reference to FIG. 12. FIG. 12 is a diagram illustrating the light leakage prevention effect of the LCDs according to the second exemplary embodiment and the second modified embodiment of the present invention.

In FIG. 12, $T_1$ represents luminance measured at both boundaries $X_1$ and $X_2$ of the vertical portion 29a or 29b of each of the storage wirings 28a, 28b, 29a and 29b of sample LCDs constructed according to the second exemplary embodiment and the second modified embodiment (i.e., FIGS. 8-10 and 11A-B, respectively). That is, $T_1$ represents a case where the inclination angles $\theta_1$ and $\theta_2$ of the inclined surfaces of the vertical portion 29a and 29b of the storage wirings 28a, 28b, 29a and 29b are 30 degrees or less. In addition, $T_2$ represents a case where an inclination angle of an inclined surface of the vertical portion of the storage wiring exceeds 30 degrees.

Referring to FIG. 12, $T_1$ shows a relatively lower luminance than $T_2$ at both boundaries $X_1$ and $X_2$ of the vertical portion 29a or 29b of each of the storage wirings 28a, 28b, 29a and 29b. That is, when the inclination angles $\theta_1$ and $\theta_2$ of the inclined surfaces of the vertical portions 29a and 29b are 30 degrees or less as in the second exemplary embodiment and the second modified embodiment, light leakage at both boundaries $X_1$ and $X_2$ of the vertical portions 29a or 29b is reduced as compared to $T_2$. Accordingly, experiment demonstrates that the contrast ratios of LCDs constructed according to the second exemplary embodiment and the second modified embodiment are higher than those of LCDs constructed according to the example of $T_2$.

Hereinafter, a method of manufacturing a display substrate according to a third exemplary embodiment of the present invention will be described with reference to FIGS. 2, 3, and 13A through 15B.

FIGS. 13A through 15B are cross-sectional views sequentially illustrating processes for fabricating a display substrate according to a third exemplary embodiment of the present invention. From this example and the one that follows, one of ordinary skill in the art will discern similar processes for fabricating other embodiments of the invention. For simplicity, elements having the same functions as those illustrated in the drawings for the first exemplary embodiment are indicated by like reference numerals, and thus their description will be omitted.

Figure 13A:
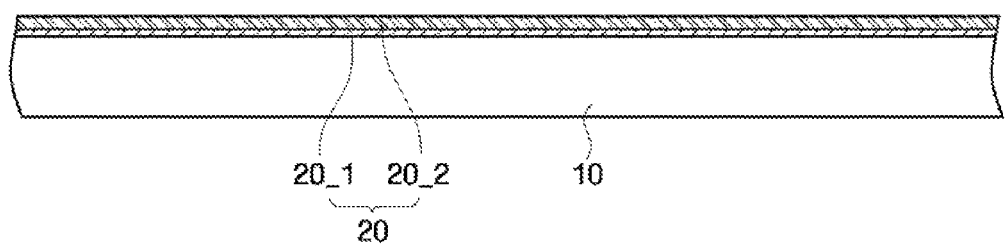
FIGS. 13A through 15B are cross-sectional views sequentially and respectively illustrating processes included in a method of manufacturing a display substrate according to a third exemplary embodiment of the present invention.
Figure 13B:
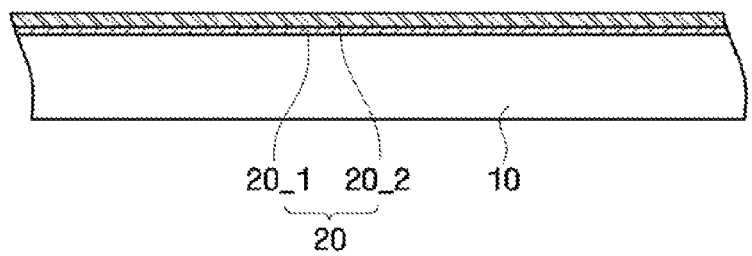

Referring to FIGS. 13A and 13B, a first conductive layer 20_1 and a second conductive layer 20_2 are sequentially deposited on a first insulating substrate 10 to form a conductive layer 20 for forming a gate wiring and a storage wiring. Here, the second conductive layer 20_2 may be made of a material having a higher etch rate than that of the first conductive layer 20_1. For example, the first conductive layer 20_1 may be made of Ti using sputtering or chemical vapor deposition (CVD), and the second conductive layer 20_2 may be made of Cu.

Figure 14A:
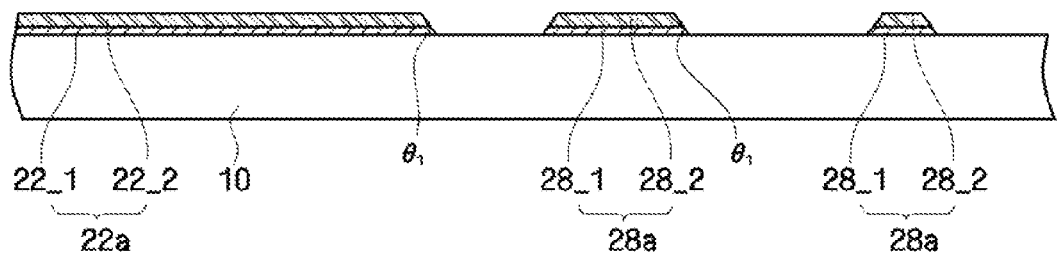
Figure 14B:
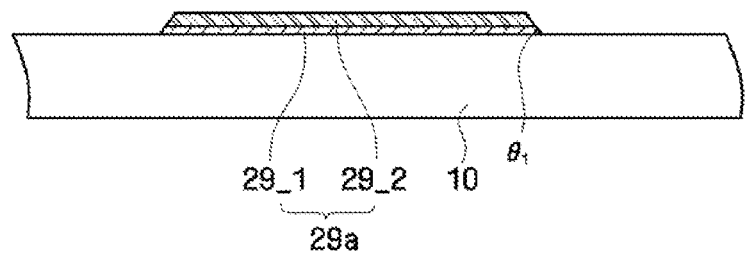

Next, referring to FIGS. 14A and 14B, the conductive layer 20 is etched to form a gate wiring 22a and 24a and a storage wiring 28a and 29a. Here, the first conductive layer 20_1 and the second conductive layer 20_2 may be etched simultaneously. Accordingly, the first conductive layer 20_1 may be changed into first conductive films 22_1, 28_1 and 29_1, and the second conductive layer 20_2 may be changed into second conductive films 22_2, 28_2 and 29_2.

When the second conductive layer 20_2 has a higher etch rate than the first conductive layer 20_1, it may be etched more actively than the first conductive layer 20_1. That is, the second conductive layer 20_2 and the first conductive layer 20_1 may be etched at different speeds according to their respective etch rates. Examples of the etchant which can simultaneously etch Ti and Cu may be TCE WO2 Etchant and TCE 2000 Etchant, etc. Here, since Ti and Cu have different etch rates with respect to the etchant, they may be etched at different speeds. Accordingly, the first conductive layer 20_1 made of Ti may be etched to form first conductive films 22_1, 28_1 and 29_1 each with a taper, and the second conductive layer 20_2 may similarly be etched to form second conductive films 22_2, 28_2 and 29_2 that each are tapered. Here, the first conductive layer 20_1 and the second conductive layer 20_2 may be etched by any suitable process, although one such suitable process is wet-etching.

Since the first conductive films 22_1, 28_1 and 29_1 and the second conductive films 22_2, 28_2 and 29_2 are tapered, the gate wiring 22a and 24a and the storage wiring 28a and 29a including the first conductive films 22_1, 28_1 and 29_1 and the second conductive films 22_2, 28_2 and 29_2 may also be tapered. Here, an inclination angle $\theta_1$ of an inclined surface of each of the gate wiring 22a and 24a and the storage wiring 28a and 29a may be 30 degrees or less with respect to a top surface of the first insulating substrate 10.

Figure 15A:
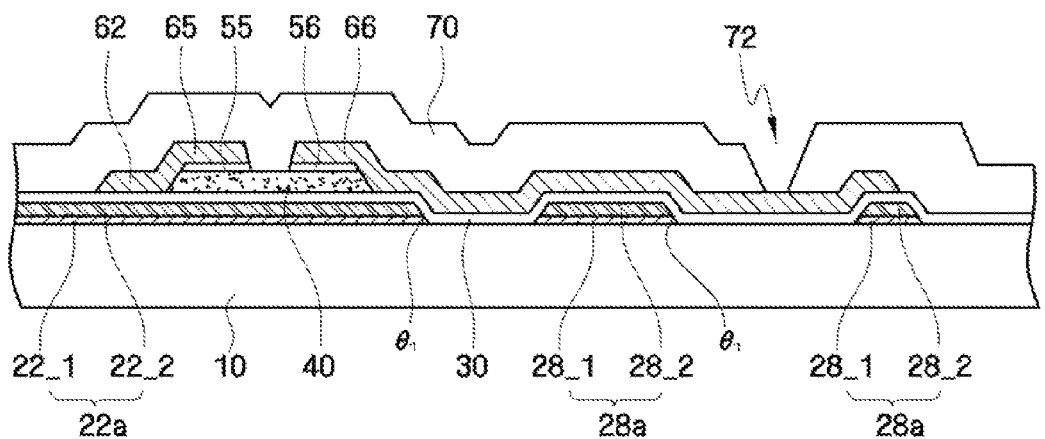
Figure 15B:
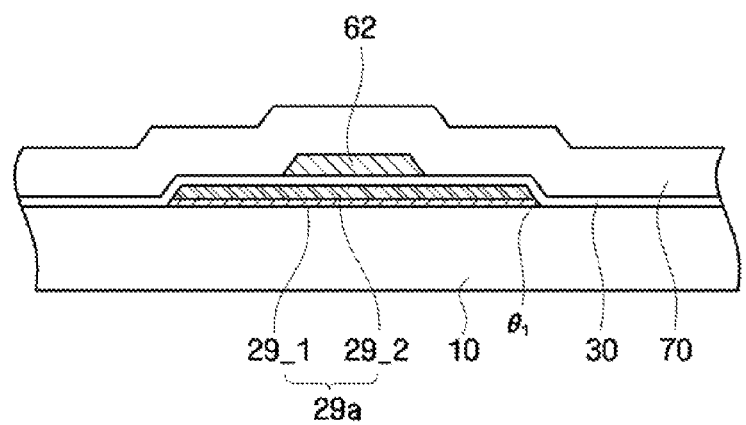

Next, referring to FIGS. 15A and 15B, a gate insulating film 30 is formed of $SiO_2$ or SiNx on the gate wiring 22a and 24a and the storage wiring 28a and 29a by using, e.g., CVD. Then, an active layer 40, ohmic contact layers 55 and 56, a data wiring 62, 65, 66 and 67, and a passivation film 70 are sequentially formed on the gate insulating film 30. Next, a contact hole 72 is formed in the passivation film 70, and ITO is deposited on the passivation film 70 by using, e.g., sputtering. The ITO is then patterned to form a pixel electrode 82, thereby forming a display substrate 100 as illustrated in FIGS. 2 and 3.

Hereinafter, a method of manufacturing a display substrate according to a third modified embodiment of the third exemplary embodiment of the present invention will be described with reference to FIGS. 5B, 6 and 16A through 17B.

FIGS. 16A through 17B are cross-sectional views sequentially illustrating processes for fabricating a display substrate according to a third modified embodiment of the third exemplary embodiment of the present invention. For simplicity, elements having the same functions as those illustrated in the drawings for the first exemplary embodiment are indicated by like reference numerals, and thus their description will be omitted.

Figure 16A:
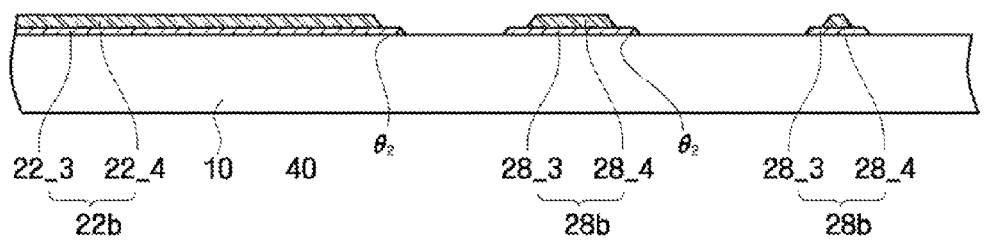
FIGS. 16A through 17B are cross-sectional views sequentially and respectively illustrating processes included in a method of manufacturing a display substrate according to a third modified embodiment of the third exemplary embodiment of the present invention.
Figure 16B:
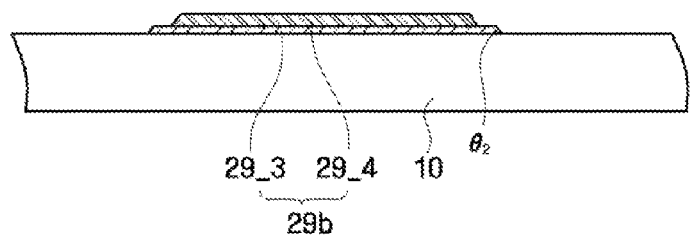
Figure 17A:
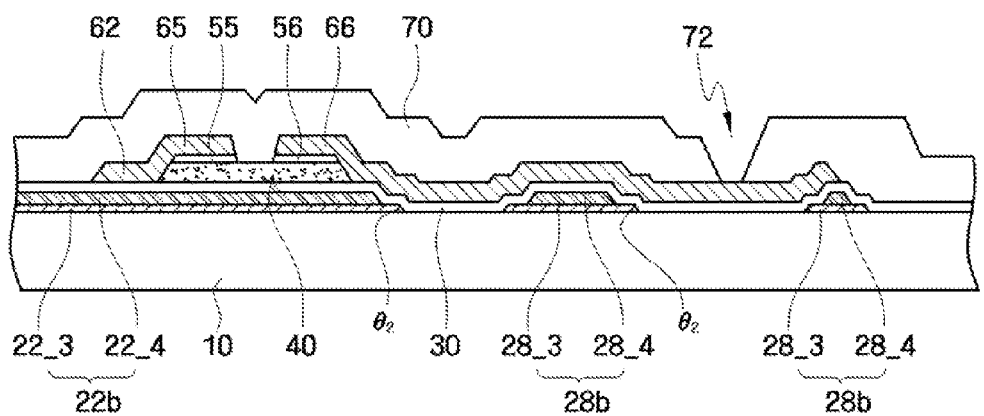
Figure 17B:
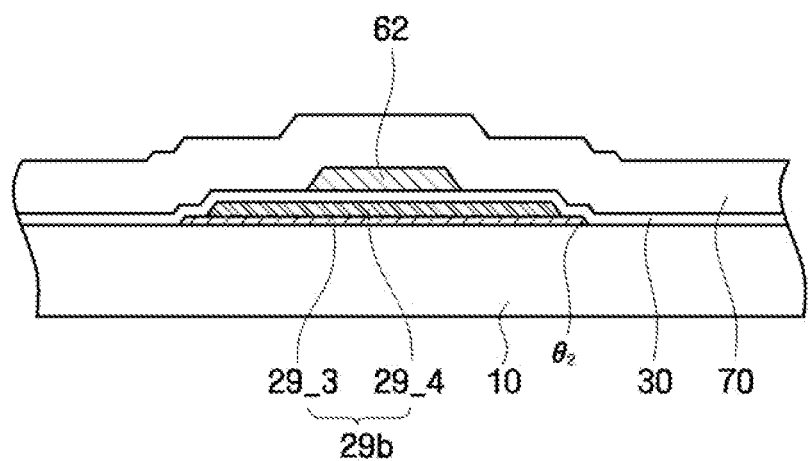

Referring to FIGS. 16A and 16B, second conductive films 22_2, 28_2 and 29_2 included in the structure of FIGS. 14A and 14B are also etched. As a result, fourth conductive films 22_4, 28_4 and 29_4 are formed. Third conductive films 22_3, 28_3 and 29_3 are substantially the same as first conductive films 22_1, 28_1 and 29_1.

The fourth conductive films 22_4, 28_4 and 29_4 are formed by additionally etching the second conductive films 22_2, 28_2 and 29_2, and may be formed narrower than the third conductive films 22_3, 28_3 and 29_3.

The third conductive films 22_3, 28_3 and 29_3 and the fourth conductive films 22_4, 28_4 and 29_4 may be formed as follows. First, a second conductive layer 20_2 shown in FIGS. 13A and 13B is etched to form the third conductive films 22_3, 28_3 and 29_3. Then, a first conductive layer 20_1 is etched to form the fourth conductive films 22_4, 28_4 and 29_4. Here, the second conductive layer 20_2 may be wet-etched, and the first conductive layer 20_1 may be dry-etched.

Regardless of whether dry-etching or wet-etching is used, the third conductive films 22_3, 28_3 and 29_3 may be tapered. Here, an inclination angle of an inclined surface of each of the third conductive films 22_3, 28_3 and 29_3 may be 30 degrees or less. In addition, the fourth conductive films 22_4, 28_4 and 29_4 may be formed narrower than the third conductive films 22_3, 28_3 and 29_3, such that each of a gate wiring and a storage wiring has a staircase structure as well as a tapered structure, which results in overlying layers that have a more gentle profile, i.e. that have more gradual inclinations.

Next, a gate insulating film 30, an active layer 40, ohmic contact layers 55 and 56, a data wiring 62, 65, 66 and 67, and a passivation film 70 are sequentially formed on the structure of FIGS. 16A and 16B. Then, a contact hole 72 is formed in the passivation film 70, and ITO is deposited on the passivation film 70 by, e.g., sputtering. The ITO is then patterned to form a pixel electrode 82, thereby forming a display substrate 100 as shown in FIGS. 5B and 6.

Figure 18A:
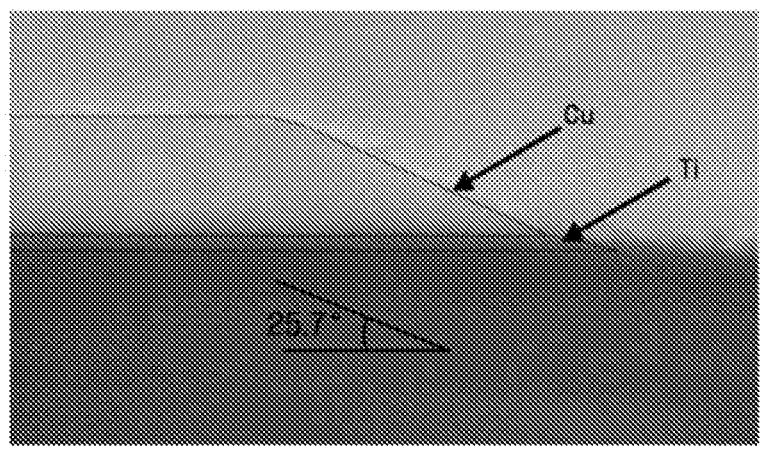
FIGS. 18A and 18B are photographs of a gate wiring or a storage wiring manufactured according to an exemplary embodiment of the present invention.
Figure 18B:
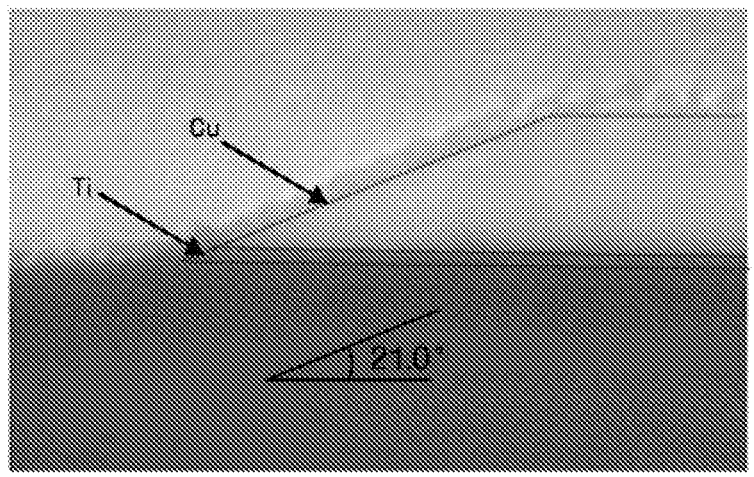

FIGS. 18A and 18B are photographs of a wiring manufactured according to an exemplary embodiment of the present invention.

Referring to FIGS. 18A and 18B, the wiring manufactured according to the current exemplary embodiment includes a first conductive film and a second conductive film. Here, the first conductive film is made of Ti, and the second conductive film is made of Cu.

As can be seen, a side surface of the wiring is tapered. More specifically, the taper angle of the wiring is less than 30 degrees. Specifically, the wiring of FIG. 18A has a taper angle of 25.7 degrees, and the wiring of FIG. 18B has a taper angle of 21.0 degrees.

The first conductive film of the wiring is formed to a thickness of about 200 Å, and the second conductive film is formed to a thickness of about 2000 Å.

While the present disclosure of invention has been particularly shown and described with reference to exemplary embodiments, it will be understood by those of ordinary skill in the art after appreciation of the disclosure that various changes in form and detail may be made therein without departing from the spirit and scope of the present teachings. The exemplary embodiments should be considered in a descriptive sense only and not for purposes of limitation.

What is claimed is:

1. A display substrate comprising:
an insulating substrate;
a gate wiring formed on the insulating substrate and extending generally in a first direction;
a data wiring which is insulated from the gate wiring, intersects the gate wiring, and which extends generally in a second direction;
a pixel electrode formed in a pixel region defined by the gate wiring and the data wiring; and
a storage wiring which is formed on the same layer as the gate wiring, is overlapped by the data wiring to be insulated from the data wiring, and which extends generally in the second direction,
wherein each of the gate wiring and the storage wiring has a tapered surface oriented generally at an inclination angle of approximately 30 degrees or less with respect to the insulating substrate.

2. The display substrate of claim 1, wherein each of the gate wiring and the storage wiring comprises a first conductive film and a second conductive film formed upon the first conductive film, wherein an etch rate of the second conductive film is different from that of the first conductive film.

3. The display substrate of claim 2, wherein the first conductive film has a tapered surface oriented generally at an inclination angle of approximately 30 degrees or less with respect to the insulating substrate.

4. The display substrate of claim 3, wherein the second conductive film is narrower than the first conductive film.

5. The display substrate of claim 4, wherein the first conductive film has a thickness of approximately 300 Å or less.

6. The display substrate of claim 4, wherein the second conductive film has a tapered surface oriented generally at an inclination angle of approximately 30 degrees or less with respect to the insulating substrate.

7. The display substrate of claim 6, wherein the inclination angle of the first conductive film is smaller than that of the second conductive film.

8. The display substrate of claim 4, wherein the tapered surfaces each comprise edges of their respective first and second conductive films, and wherein the edges of each tapered surface are substantially coplanar.

9. The display substrate of claim 4, wherein the tapered surfaces each comprise a first edge of the respective first conductive film and a second edge of the respective second conductive film, and wherein each first edge is offset from its respective second edge.

10. The display substrate of claim 2, wherein the first conductive film contains titanium (Ti), and the second conductive film contains copper (Cu).

11. A liquid crystal display (LCD) comprising:
a first display substrate comprising an insulating substrate, a gate wiring formed on the insulating substrate and extending in a first direction, a data wiring which is insulated from the gate wiring, intersects the gate wiring, and which extends in a second direction, a pixel electrode formed in a pixel region defined by the gate wiring and the data wiring, and a storage wiring which is formed on the same layer as the gate wiring, is overlapped by the data wiring to be insulated from the data wiring, and which extends in the second direction;
a second display substrate facing the first display substrate and comprising a black matrix; and
a liquid crystal layer interposed between the first display substrate and the second display substrate,
wherein each of the gate wiring and the storage wiring has a tapered surface oriented generally at an inclination angle of approximately 30 degrees or less with respect to the insulating substrate.

12. The LCD of claim 11, wherein each of the gate wiring and the storage wiring comprises a first conductive film and a second conductive film formed upon the first conductive film, wherein an etch rate of the second conductive film is different from that of the first conductive film.

13. The LCD of claim 12, wherein the first conductive film has a tapered surface oriented generally at an inclination angle of 30 degrees or less with respect to the insulating substrate.

14. The LCD of claim 13, wherein the second conductive film is narrower than the first conductive film.

15. The LCD of claim 14, wherein the first conductive film has a thickness of approximately 300 Å or less.

16. The LCD of claim 14, wherein the second conductive film has a tapered surface oriented generally at an inclination angle of approximately 30 degrees or less with respect to the insulating substrate.

17. The LCD of claim 16, wherein the inclination angle of the first conductive film is smaller than that of the second conductive film.

18. The LCD of claim 14, wherein the tapered surfaces each comprise edges of their respective first and second conductive films, and wherein the edges of each tapered surface are substantially coplanar.

19. The LCD of claim 14, wherein the tapered surfaces each comprise a first edge of the respective first conductive film and a second edge of the respective second conductive film, and wherein each first edge is offset from its respective second edge.

20. The LCD of claim 12, wherein the first conductive film contains Ti, and the second conductive film contains Cu.

21. A method of manufacturing a display substrate, the method comprising:
forming a gate wiring on the insulating substrate, the gate wiring extending in a first direction;
forming a storage wiring on the same layer as the gate wiring, the storage wiring extending in a second direction;
forming a data wiring which is insulated from the gate wiring, intersects the gate wiring, and which extends in the second direction; and
forming a pixel electrode in a pixel region defined by the gate wiring and the data wiring,
wherein each of the gate wiring and the storage wiring has a tapered surface oriented generally at an inclination angle of approximately 30 degrees or less with respect to the insulating substrate.

22. The method of claim 21, wherein the forming of the gate wiring and the forming of the storage wiring each comprise:
forming a first conductive layer on the insulating substrate; and
forming a second conductive layer on the first conductive layer,
wherein an etch rate of the second conductive layer is higher than that of the first conductive layer.

23. The method of claim 22, wherein the first conductive layer contains Ti, and the second conductive layer contains Cu.

24. The method of claim 22, further comprising forming a first conductive film and a second conductive film by simultaneously etching the first conductive layer and the second conductive layer.

25. The method of claim 24, wherein each of the first conductive film and the second conductive film has a tapered surface oriented generally at an inclination angle of approximately 30 degrees or less with respect to the insulating substrate.

26. The method of claim 25, wherein the tapered surfaces each comprise edges of their respective first and second conductive films, and wherein the edges of each tapered surface are substantially coplanar.

27. The method of claim 25, wherein the tapered surfaces each comprise a first edge of the respective first conductive film and a second edge of the respective second conductive film, and wherein each first edge is offset from its respective second edge.

28. The method of claim 24, further comprising etching the second conductive film after the simultaneously etching the first conductive layer and the second conductive layer.

29. The method of claim 22, further comprising sequentially etching the second conductive layer and the first conductive layer.

30. The method of claim 29, wherein the sequentially etching the second conductive layer and the first conductive layer further comprises wet-etching the second conductive layer and dry-etching the first conductive layer.

* * * * *